United States Patent [19]
Sobue et al.

[11] Patent Number: 5,703,403
[45] Date of Patent: Dec. 30, 1997

[54] ELECTRODE FOR SEMICONDUCTOR DEVICE AND METHOD FOR PRODUCING THE SAME

[75] Inventors: Susumu Sobue, Obu; Takeshi Yamauchi; Shinichi Mukainakano, both of Nagoya, all of Japan

[73] Assignee: Nippondenso Co., Ltd., Kariya, Japan

[21] Appl. No.: 754,383

[22] Filed: Nov. 21, 1996

Related U.S. Application Data

[63] Continuation of Ser. No. 338,785, Nov. 8, 1994, abandoned.

[30] Foreign Application Priority Data

Nov. 8, 1993  [JP]  Japan ................................. 5-278301

[51] Int. Cl.$^6$ ........................... H01L 23/48; H01L 23/52; H01L 29/40
[52] U.S. Cl. ............................ 257/751; 257/750
[58] Field of Search ........................ 257/751, 750, 257/764, 765

[56] References Cited

U.S. PATENT DOCUMENTS

| | | |
|---|---|---|
| 4,141,022 | 2/1979 | Sigg et al. |
| 4,989,064 | 1/1991 | Kubokoya et al. |
| 5,049,975 | 9/1991 | Ajika et al. ............................ 257/764 |

FOREIGN PATENT DOCUMENTS

| | | |
|---|---|---|
| 59-47741 | 3/1984 | Japan. |
| 3-3395 | 3/1991 | Japan. |
| 3262127 | 11/1991 | Japan. |
| 4-42537 | 2/1992 | Japan. |

OTHER PUBLICATIONS

Sobue et al: "Metastable Phase Formation in Al alloy/TiN/Ti/Si Systems", First International Symposium on Control of Semiconductor Interfaces, (1993).

*Primary Examiner*—Stephen Meier
*Attorney, Agent, or Firm*—Cushman, Darby & Cushman IP Group of Pillsbury, Madison & Sutro LLP

[57] ABSTRACT

An electrode for semiconductor devices, which can restrain the occurrence of Al voids and has a high barrier effect, is obtained by inserting a material which has a close resemblance in crystal structure to the barrier layer of a contact part and the aluminum alloy with the crystal surface thereof being oriented mainly at the (111) plane into the interface between the above barrier layer and the aluminum alloy. A semiconductor device according to the present invention comprises a silicon substrate, an interlayer insulating film partially formed on the silicon substrate, a titanium silicide layer formed on the silicon substrate at the part where the interlayer insulating film is not formed, a titanium layer formed on the interlayer insulating film and connected to the titanium silicide layer, a titanium nitride layer formed on the titanium layer and the titanium silicide layer, a Ti—Al—N layer such as $Ti_3AlN$ and formed on the titanium nitride layer, and an aluminum alloy (Al-1%Si-0.5%Cu) composing an electrode formed on the Ti—Al—N layer.

6 Claims, 10 Drawing Sheets

Ti3AlN (111)

4.1120 Å

2.91 Å

5nm

5nm

ELECTRODE FOR SEMICONDUCTOR DEVICE AND METHOD FOR PRODUCING THE SAME

CROSS REFERENCE TO RELATED APPLICATION

This application a continuation of application Ser. No. 08/338,785, filed Nov. 8, 1994, which was abandoned upon the filing hereof.

This application claim the benefit of priority from prior Japanese patent application No. 5-278301 filed on Nov. 8, 1993, the contents of which are incorporated herein by reference.

BACKGROUND OF THE INVENTION

1. Field of the Invention

The present invention generally relates to an electrode for semiconductor devices. More particularly, the present invention relates to an electrode wiring which is particularly effective for a highly integrated and highly reliable semiconductor device and can reduce voids caused to at the inside of an interconnection (hereinafter referred to as "Al voids") and obtain a high barrier effect.

2. Description of the Related Arts

Recently, as the integration of elements has advanced, technologies for downscaling and multilayering have become essential. Along with this refinement, wire widths of aluminum wiring have been designed to be thinner. However, it is known that when the wire width is smaller than 2 at 3 μm, Al voids are caused to the inside of the aluminum alloy wiring. Also, due to the multilayers composed of various thin films, stress is applied to the inside structure of elements, and the above-described Al voids are caused thereto. If these Al voids develop, the reliability may be impaired by various troubles caused thereby, such as the disconnection of the aluminum alloy wiring, the increase in wiring resistance due to the reduction in the cross section of the aluminum alloy wiring, the breakage of elements due to heat generation, the delay in operation speed and electromigration due to the application of large current.

On the other hand, it is also public knowledge that in the heat treatment process for the wiring, Al as the main component of the wiring and Si as the main component of the substrate mutually diffuse and consequently a defect, such as the breakage of connection or the increase in contact resistance, is caused. As a solution to this problem, for example, such a method is widely used that a barrier layer, such as a refractory metal with high melting point (e.g., Ti, W), an intermetallic compound (e.g., Ti-W family), a refractory metal silicide with a high melting point (e.g., $TiSi_2$) and a refractory metal nitride with a high melting point (e.g., TiN) are disposed between the silicon substrate and the aluminum alloy wiring for the purpose of providing a barrier effect. Recently, in order to improve the barrier effect of the barrier layer, a method has been used wherein the barrier layer was once exposed to the air after the formation thereof for intentional oxidization for hardening the surface thereof (as disclosed in the Japanese Unexamined Patent Publication No. 4-42537, for example).

As another conventional method of restricting the occurrence of Al voids, copper is mixed in the aluminum and silicon alloy wiring to form Al—Si—Cu wiring to cause the copper to act as an obstacle to hinder the movement of Al atoms. A metallic wiring formed by this method has been disclosed in the U.S. Patent Publication No. 4989064, which is characterized by an arrangement wherein the crystal surface of the Al—Si—Cu wiring is oriented mainly in the (111) plane, so that Al voids can be restrained better. That is, as the (111) plane is filled with Al atoms at the highest density, the movement of an Al atom is restrained by other Al atoms, whereby the internal stress of the aluminum and silicon alloy layer is released and consequently the occurrence of Al voids can be reduced.

However, the orientational effect of the (111) plane of this Al—Si—Cu wiring is in close relation with the crystal structure of the layer therebeneath. It has been found that if a titanium nitride (TiN) layer composing a metallic nitride film with a high melting point as a barrier metal was overlaid with aluminum alloy wiring as disclosed in the Japanese Examined Patent Publication No. 3-3395 and the Japanese Patent Unexamined Publications Nos. 4-42537 and 3-262127, for example, the formation of the crystal surface of the aluminum alloy regularly oriented at the (111) plane was difficult.

It has also been found that if the formation of the crystal surface of the aluminum alloy regularly oriented at the (111) plane fails, the occurrence of Al voids could not be restrained. That is, if a barrier layer was inserted to prevent the mutual diffusion of aluminum and silicon, the aluminum alloy could not be formed with regular orientation at the (111) plane, and as a result, Al voids occur.

SUMMARY OF THE INVENTION

Accordingly, with respect to the electrode wiring of a semiconductor device provided with an aluminum alloy wiring layer having the (111) plane on a barrier layer composed of a metal with a high melting point, it is an object of the present invention to provide an electrode wiring for a semiconductor device which can easily form an aluminum alloy wiring having the orientation at the (111) plane while maintaining the barrier effect of the barrier layer.

The electrode for a semiconductor device according to the present invention, which is composed so as to achieve the above object, comprises a barrier layer formed on a substrate and composed of an intermetallic compound containing a refractory metal with a high melting point and nitrogen (N), a nitride layer compound layer formed on the barrier layer and composed by forming an intermetallic compound containing the elements composing the barrier layer and aluminum (Al) alloy layer for a thickness of 30 Å or more, and an aluminum alloy wiring formed on the nitride layer and the crystal surface thereof is oriented mainly at the (111) plane.

Here, it is preferable that the oxygen concentration of the barrier layer should be 1 at % or less and that the oxygen concentration of the interface between the barrier layer and the nitride layer should also be 1 at % or less. The term "at %" is the atomic percent, which is defined as the number of atoms of an element in 100 atoms representative of a substance.

It is also preferable that a margin difference between the interatomic distance of the barrier layer and the interatomic distance of the nitride layer should be 5% or less and that a margin difference between the interatomic distance of the nitride layer and the interatomic distance of the aluminum alloy wiring should also be 5% or less.

The metal with a high melting point composing the barrier layer should preferably be either titanium (Ti), tungsten (W) or molybdenum (Mo). Also, the substrate should preferably be composed of a silicon substrate, the barrier layer should preferably be composed of titanium nitride (TiN), and the nitride layer should preferably be composed of $Ti_3AlN$.

On the other hand, the method for producing the electrode wiring of a semiconductor device according to the present invention comprises a step for forming a barrier layer composed of an intermetallic compound containing a metal with a high melting point and nitrogen (N) as components on the substrate in such a way that any oxygen is not contained therein or the oxygen concentration thereof is 1 at % or less, a step for consecutively forming aluminum alloy wiring on the barrier layer after the formation of the barrier layer in such a way that the crystal surface thereof is oriented mainly at the (111) plane, and a step for forming a nitride layer composed by forming an intermetallic compound containing the elements composing the barrier layer and aluminum (Al) for a thickness of 30 Å or more between the barrier layer and the aluminum alloy wiring by heat treating the barrier layer and the aluminum alloy wiring.

It should be noted that the step for forming the barrier layer can include a step for forming the barrier layer by causing nitrogen to react to the metal with a high melting point within the gas atmosphere containing the nitrogen while maintaining the temperature of the substrate within a range from 200° C. (392° F.) to 300° C. (572° F.).

Furthermore, the step for forming the nitride layer comprises a step for heat treating the barrier layer and the aluminum alloy wiring at a temperature ranging from 300° (572° F.) to 450° C. (842° F.) for 30 minutes or more.

Moreover, the step for forming the barrier layer and the step for forming the aluminum alloy wiring should preferably be consecutively carried out without being exposed to the air.

In the electrode wiring of a semiconductor device according to the present invention, a barrier layer composed of an intermetallic compound containing a metal with a high melting point and nitrogen (N) as components is formed on the substrate, and subsequently aluminum alloy wiring is formed on the barrier layer without being exposed to the air. Generally, the aluminum alloy tends to be oriented in the (111) plane. When the aluminum alloy wiring is merely formed on the barrier layer, however, the barrier layer and the aluminum alloy wiring in the vicinity of the connection interface thereof have residual internal stress respectively due to the difference in lattice constant between the barrier layer and the aluminum alloy wiring. According to the present invention, however, the nitride layer composed of an intermetallic compound containing the elements composing the barrier layer and aluminum as compounds is formed for a thickness of 30 Å or more by heat treating after the formation of the aluminum alloy wiring. Depending on the type of the metal with a high melting point, the lattice constant of the nitride layer is approximately 3 Å. To release the lattice mismatching, 10 atomic layers are required. That is, the lattice mismatching can be released by forming a nitride layer of a thickness of 30 Å or more, whereby the internal stress acting on the interface between the nitride layer and the aluminum alloy wiring can be eliminated. By eliminating the internal stress at the side of the aluminum alloy wiring, the orientational effect at the (111) plane of the aluminum alloy wiring can be improved.

Incidentally, the above nitride layer is thick enough to eliminate the internal stress acting on the interface between the barrier layer and the aluminum alloy wiring. In the conventional electrode wiring formed by overlaying aluminum alloy wiring on the titanium nitride (TiN), it is also conceivable that an intermetallic compound, as described above, may be produced during the deposition of aluminum alloy wiring. Even if this the case, the reacting layer of aluminum and titanium nitride (TiN) is negligibly thin, and therefore can not substitute for the nitride layer which is thick enough to eliminate the internal stress according to the present invention for the following reason. In the conventional producing method, the barrier layer composed of titanium nitride (TiN), for example, is oxidized by being exposed to the air to improve the barrier effect. Then, the barrier layer is stabilized by oxidation, and almost inactive to aluminum by heat treatment. In order for the barrier layer to be active to aluminum, the barrier layer should be heated to 550° C. (1022° F.) or more. Therefore, even if the intermetallic compound had been produced in the conventional structure, the film thereof would have been very thin as long as the temperature of the aluminum deposition was 300° C. (572° F.) or so. On the other hand, according to the present invention, as the barrier layer is not exposed to the air after the formation thereof, the intermetallic compound containing the elements composing the barrier layer and aluminum as components can be formed for a thickness of 30 Å or more. Therefore, the internal stress acting on the interface between the nitride layer and the aluminum alloy wiring can be eliminated, which clearly distinguishes the present invention from the conventional counterparts.

In the electrode wiring of an semiconductor device according to the present invention, the lattice mismatching can be released by forming a nitride layer for a thickness of 30 Å or more and consequently, the internal stress acting on the interface between the nitride layer and the aluminum alloy wiring can be eliminated. Accordingly, when the internal stress at the side of the aluminum alloy wiring side is eliminated, the orientational effect at the (111) plane of the aluminum alloy wiring is improved.

BRIEF DESCRIPTION OF THE DRAWINGS

Other objects, features and characteristics of the present invention will be appreciated from a study of the following detailed description, the appended claims, and drawings, all of which form a part of this application. In the drawings:

DETAILED DESCRIPTION OF THE EMBODIMENTS

A first embodiment according to the present invention will be described below with reference to the drawings.

Figure 1:
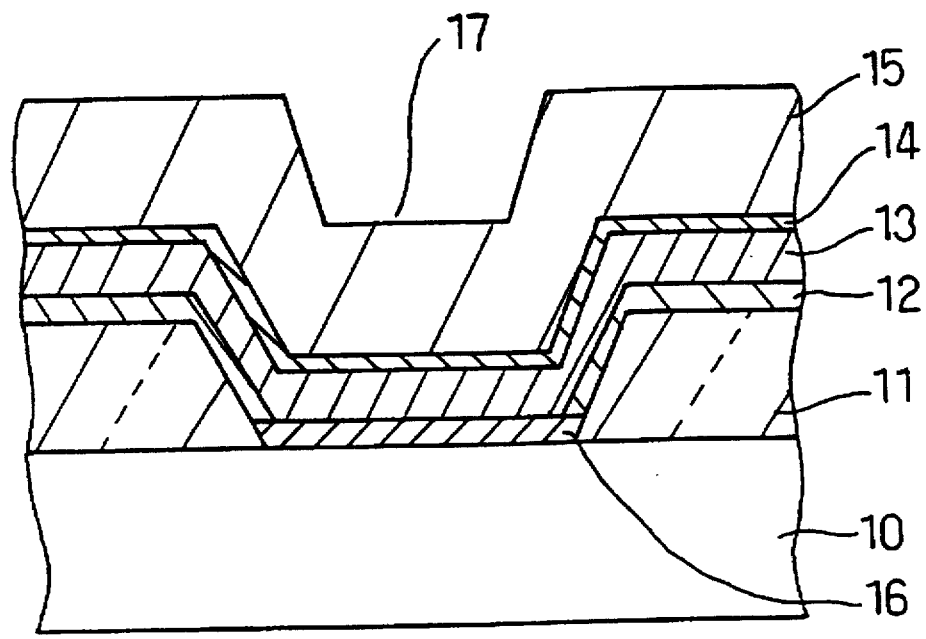
FIG. 1 is a cross-sectional view illustrating the first embodiment of a semiconductor device according to the present invention.

FIG. 1 is a cross-sectional view showing a semiconductor device of the first embodiment. Roughly summarizing, the semiconductor device comprises a silicon substrate 10, an interlayer insulating film 11 partially formed on the silicon substrate 10, a titanium silicide layer 16 formed on the silicon substrate 10 at the part where the interlayer insulating film 11 is not formed, a titanium layer 12 formed on the interlayer insulating film 11 and connected to the titanium silicide layer 16, a titanium nitride layer 13 formed on the titanium layer 12 and the titanium silicide layer 16, a Ti—Al—N layer 14 such as Ti$_3$AlN formed on the titanium nitride layer 13, and an aluminum alloy 15 (e.g., Al-1%Si-0.5%Cu) which is an electrode formed on the Ti—Al—N layer 14.

Figure 3:
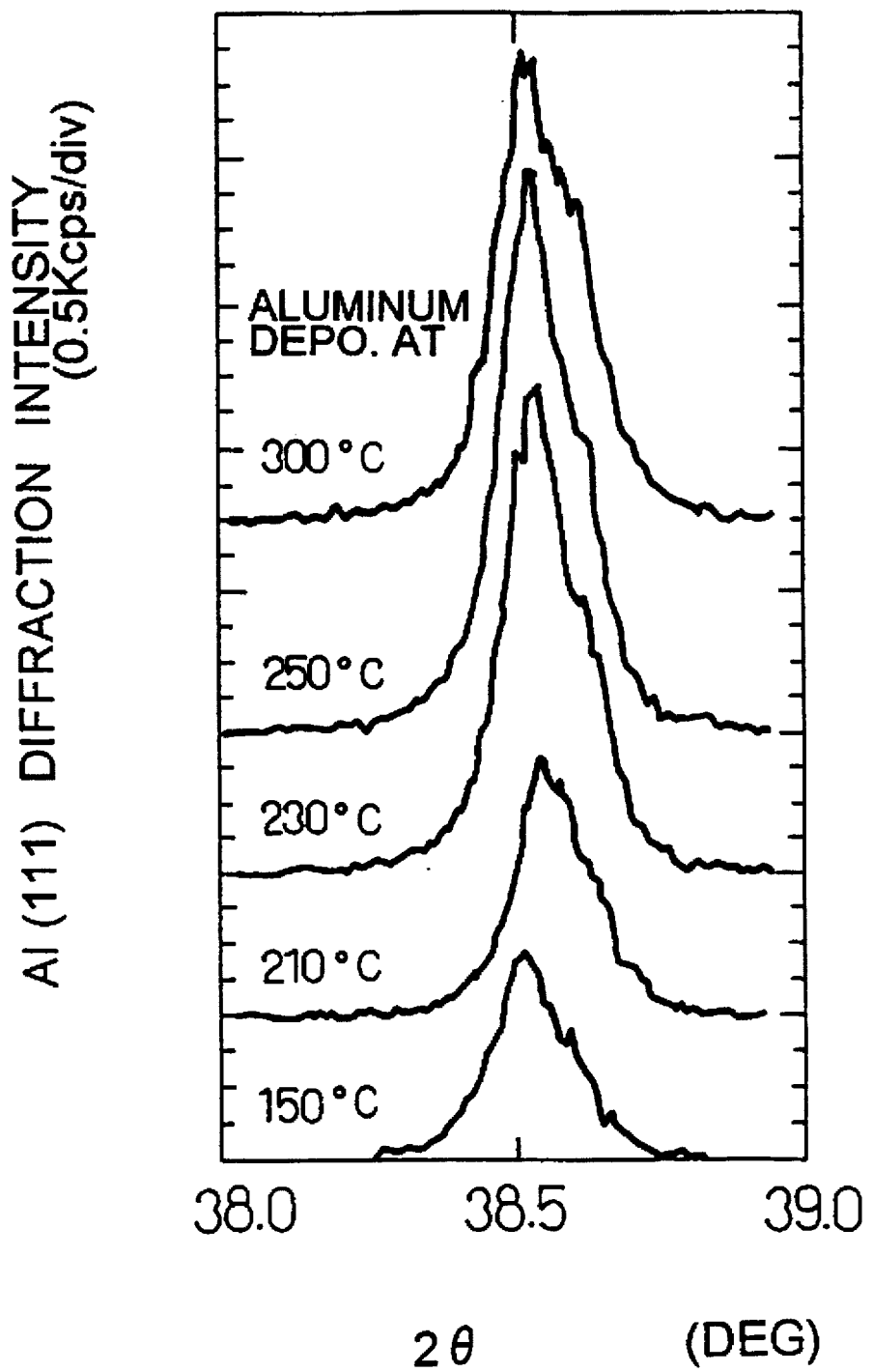
FIG. 3 is an X-ray diffraction chart of the Al (111) plane of the semiconductor device.
Figure 4:
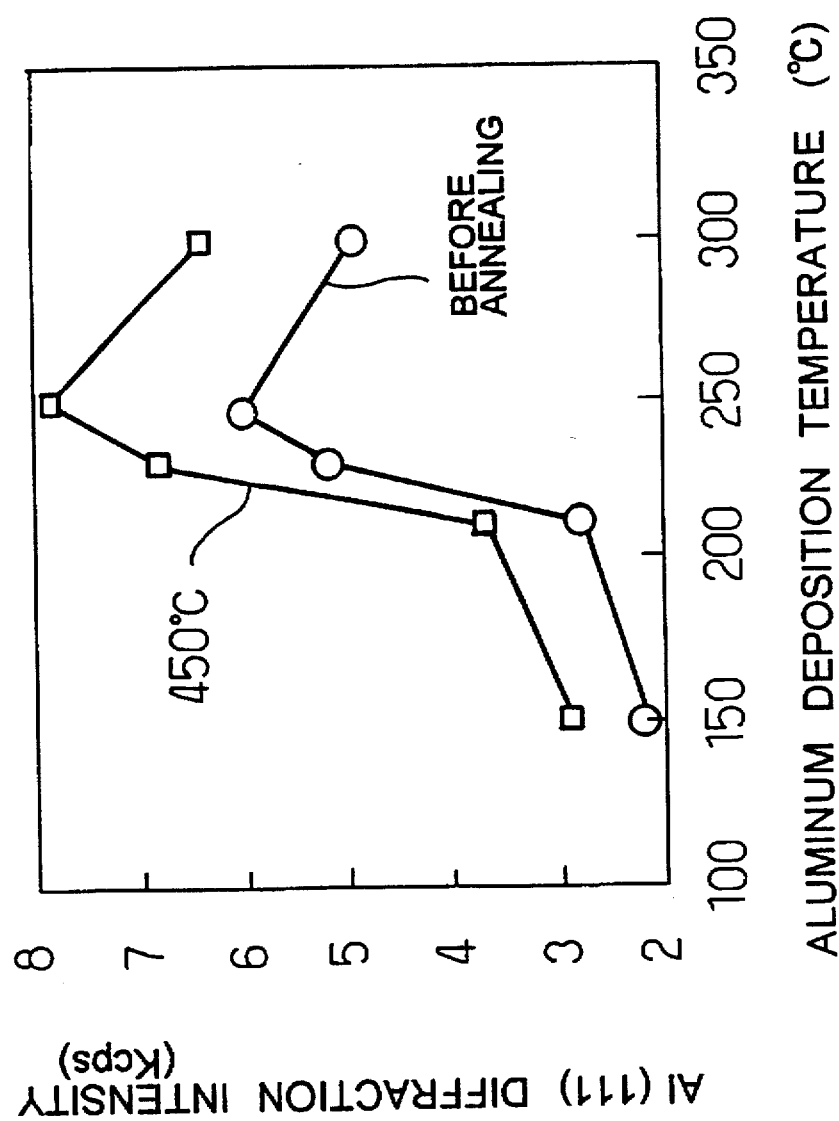
FIG. 4 is an X-ray diffraction chart illustrating the variation in the diffraction strength against the deposition temperature of the Al (111) plane of the semiconductor device.

Now, the production method for the semiconductor device shown in FIG. 1 will be described referring to FIG. 2. In the semiconductor device, shown in FIG. 2, the interlayer insulating film 11 made of phosphoric silicate glass (PSG), for example, is formed on the silicon substrate 10 by the evaporation method or the chemical vapor deposition (CVD) method. This interlayer insulating film 11 is partially removed to form a contact hole 17. Then, the titanium layer 12 is deposited to a thickness of 20 nm by the spattering method, the titanium nitride layer 13 is deposited to a thickness of 80 nm by the reactive sputtering method, and the aluminum alloy 15 (e.g., Al-1%Si-0.5%Cu) is deposited to a thickness of 100 nm by the sputtering method, which are consecutively deposited one above another in such a way that these layers 12, 13 and 15 can electrically and partly be connected to the silicon substrate 10. During this continuous deposition, the titanium layer 12, titanium nitride layer 13 and aluminum alloy layer 15 are not exposed to the air. Therefore, there is little oxygen (at most 1 at %) inside and between each layer. The titanium layer 12, the titanium nitride layer 13 and the Al—Si—Cu layer 15 are deposited at the preset effective substrate temperature. As the titanium nitride layer 13 is deposited by causing titanium to react in the N$_2$—Ar gas atmosphere plasma, the composition ratio and crystal structure thereof subtly vary according to the depositing conditions, such as effective substrate temperature, depositing pressure, N$_2$—Ar gas ratio and the presence of self-bias due to rf bias. The orientational effect of the (111) plane of the crystal surface of the aluminum alloy 15, which depends on the crystal effect of the underlayer, may be good or bad depending on the depositing conditions of the titanium nitride layer 13. FIG. 3 illustrates the results of X-ray diffraction of the (111) plane of the aluminum alloy 15. When the variation in the diffraction strength of the (111) plane of the aluminum alloy 15 with respect to the effective substrate temperature at the time of the deposition is studied, it is understood that the orientational effect of the (111) plane of the aluminum alloy 15 is the strongest when the effective substrate temperature is within the range from 230° C. (446° F.) to 300° C. (572° F.). FIG. 4 illustrates the X-ray diffraction strength with respect to the depositing temperature of the aluminum alloy 15. This figure shows that the orientational effect of the (111) plane of the aluminum alloy 15 is the strongest when the effective substrate temperature is within the range from 230° C. (446° F.) to 300° C. (572° F.) as described above. The orientational effect can further be improved through heat treatment, the reason for which will be described herein later.

Figure 2:
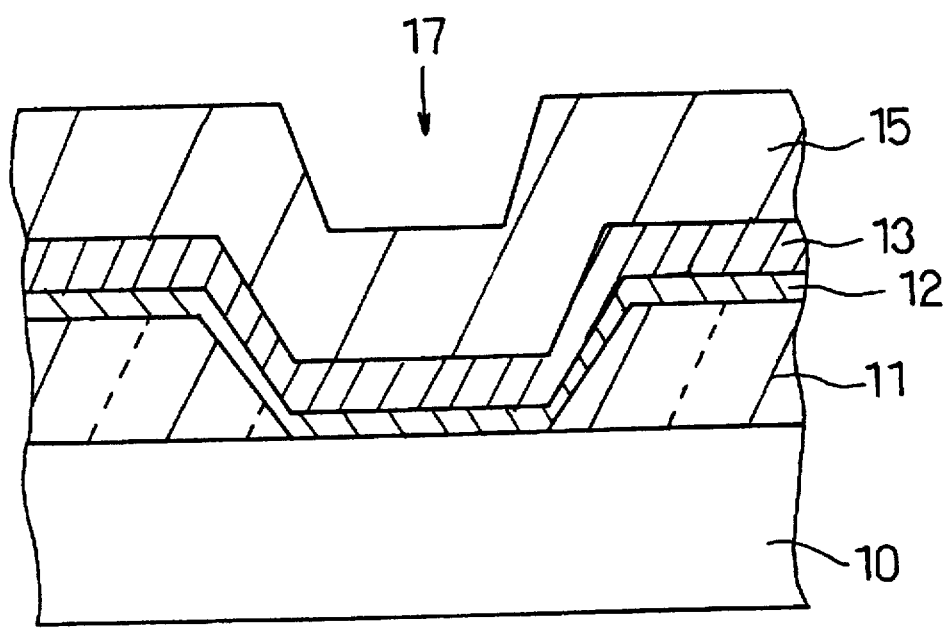
FIG. 2 is a cross-sectional view illustrating the state before heat treatment in the manufacturing of the semiconductor device illustrated in FIG. 1.

The semiconductor device of this embodiment can be obtained by annealing the semiconductor device illustrated in FIG. 2 at 450° C. (842° F.) for at least 30 minutes. Here, the titanium silicide layer 16 is formed when the titanium layer 12 reacts to the silicon substrate 10 at the portion where the titanium later 12 is connected to the silicon substrate 10.

On the other hand, the Ti—Al—N layer 14 is formed when Ti, Al and N react to each other between the titanium nitride layer 13 and the aluminum alloy 15. Of course, a very small quantity of a Ti—Al—N family compound can be produced without annealing when the aluminum alloy 15 is deposited within a certain range of the depositing conditions and without being exposed to the air after the titanium nitride layer 13 is deposited. It was found, however, that a large quantity of a Ti—Al—N family compound was formed when annealing was applied around 450° C. (842° F.).

Table 1 shows a summary of the relation between the depositing conditions of the titanium nitride layer 13 and the generation of the Ti—Al—N family compound.

TABLE 1

| Ex No. | N$_2$/(Ar + N$_2$) ratio in TiN deposition | Self-bias (V) due to rf bias | Effective substrate temperature in deposition (°C. (°F.) | Heat treatment temperature (°C. (°F.)) | Quantity of Ti—Al—N family compound |
|---|---|---|---|---|---|
| Ex. 1 | 0.3 | 0 | 230 (446) | — | Very small |
| Ex. 2 | 0.3 | 0 | 230 (446) | 450 (842) | Large |
| Ex. 3 | 0.3 | −240 | 230 (446) | — | Very small |
| Ex. 4 | 0.3 | −240 | 230 (446) | 450 (842) | Large |
| Ex. 5 | 0.4 | 0 | 230 (446) | — | Small |
| Ex. 6 | 0.4 | 0 | 230 (446) | 450 (842) | Very large |
| Ex. 7 | 0.4 | −240 | 230 (446) | — | Small |
| Ex. 8 | 0.4 | −240 | 230 (446) | 450 (842) | Large |
| Ex. 9 | 0.5 | 0 | 230 (446) | — | Very small |
| Ex. 10 | 0.5 | 0 | 230 (446) | 450 (842) | Large |
| Ex. 11 | 0.5 | −240 | 230 (446) | — | Very small |
| Ex. 12 | 0.5 | −240 | 230 (446) | 450 (842) | Large |

Figure 5:
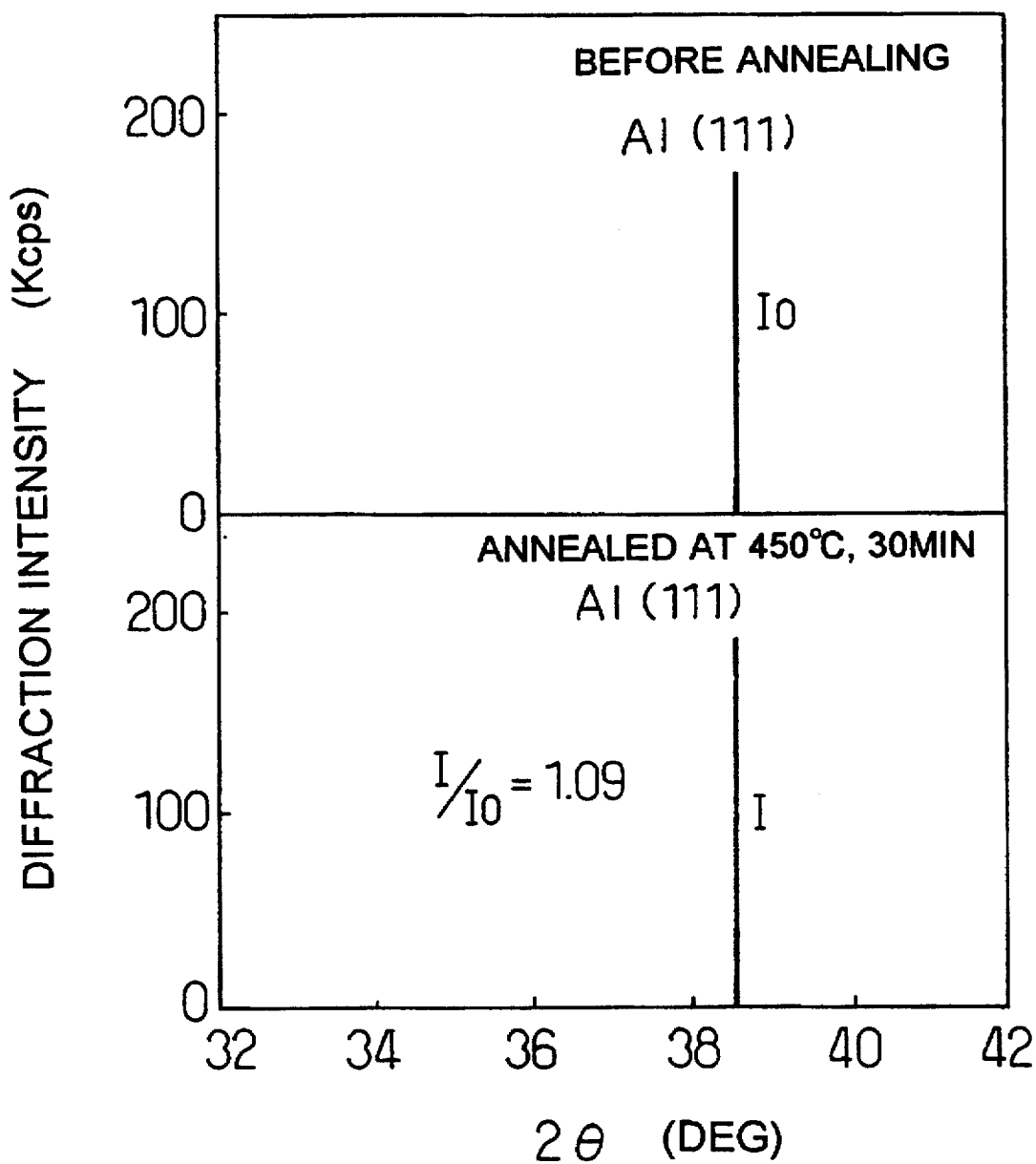
FIG. 5 is a chart showing X-ray diffraction patterns of the Al (111) plane of the semiconductor devices before and after annealing.
Figure 6:
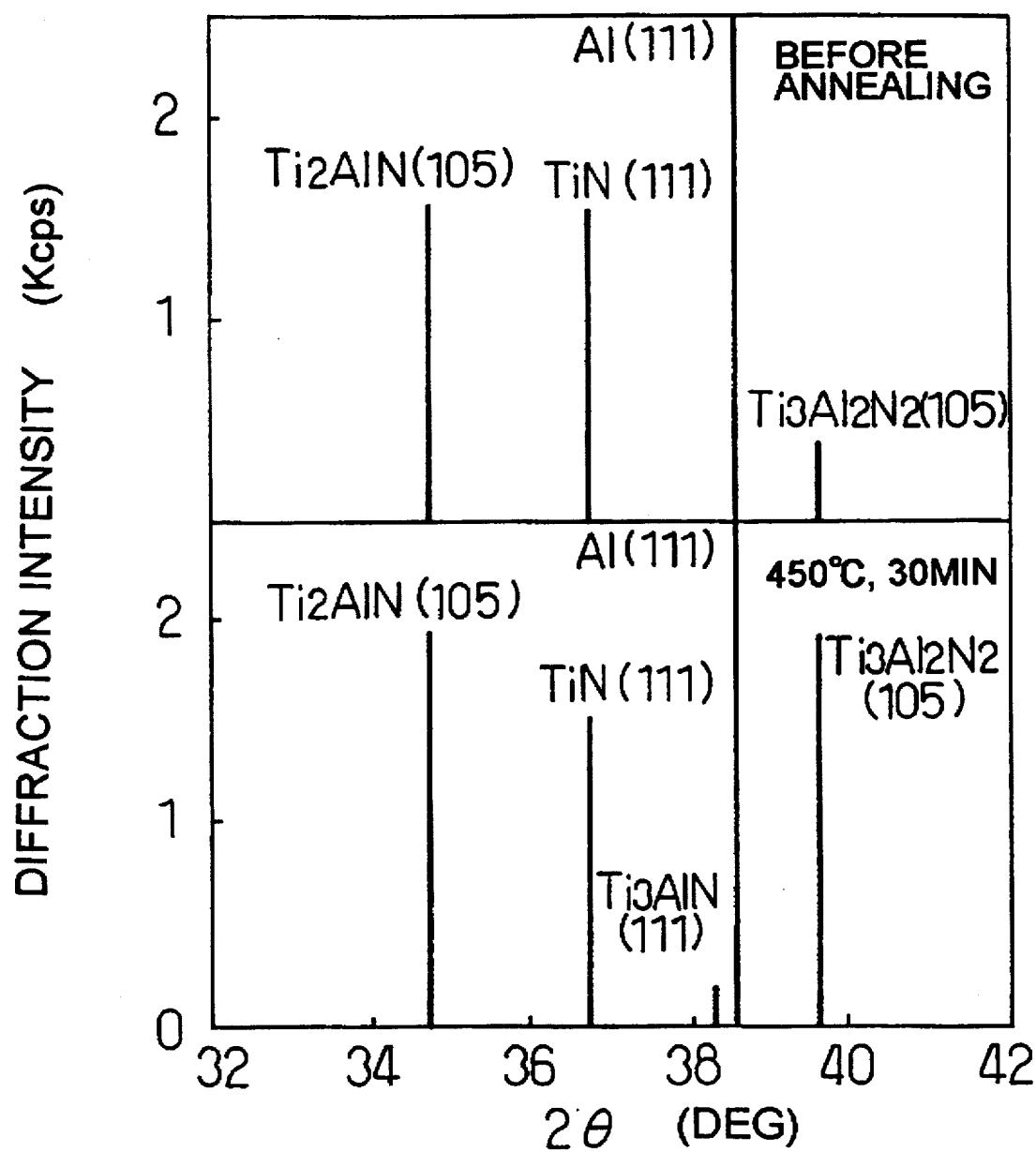
FIG. 6 is a chart showing X-ray diffraction patterns from the samples before and after annealing.

From Table 1, it is understood that the sample prepared under the condition No. 6 contains the largest quantity of a Ti—Al—N family compound. When X-ray diffraction is applied before and after annealing to the example deposited under the condition No. 6 based on the above findings, the diffraction strength of the Al (111) plane increases approximately 1.1 times as much as the same before annealing as shown in FIG. 5. When FIG. 5 is magnified as shown in FIG. 6, it is recognized that diffraction peaks have also been detected from the compounds Ti$_2$AlN, Ti$_3$AlN and Ti$_3$Al$_2$N$_2$ as well as from the TiN (111) plane. The improvement of the orientational effect of the Al (111) plane by means of annealing allows the growth of aluminum grains, to which the production of a Ti—Al—N family compound relates at the interface of the aluminum alloy and the titanium nitride. As the Ti—Al—N family compound contains all the aluminum and titanium nitride components, the crystal structure (i.e, the atomic arrangement) and interatomic distance thereof have a close resemblance to those of aluminum and titanium nitride.

Figure 7A:
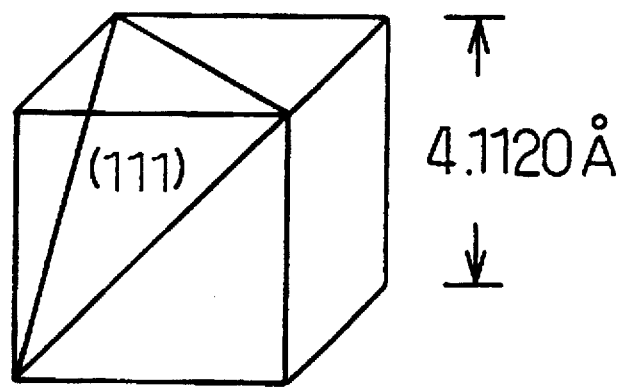
FIG. 7A is a view showing the crystal structure of $Ti_3AlN$.
Figure 7B:
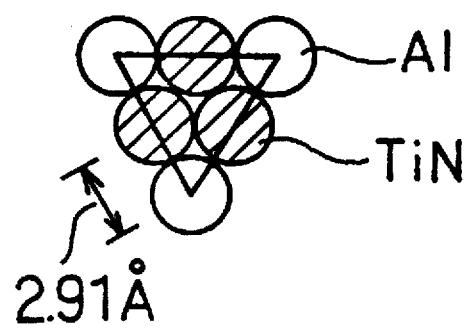
FIG. 7B is a model view showing the arrangement of atoms on the (111) plane thereof.
Figure 8A:
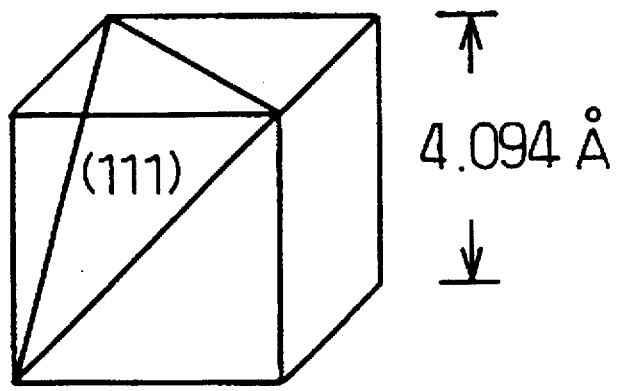
FIG. 8A is a view showing the crystal structure of aluminum.
Figure 8B:
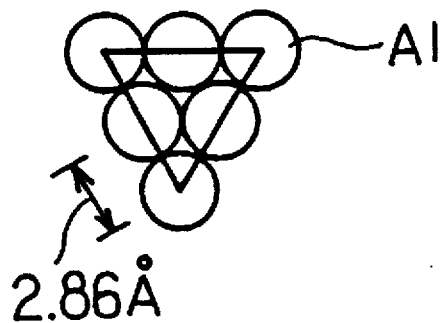
FIG. 8B is a model view showing the arrangement of atoms on the (111) plane thereof.
Figure 9A:
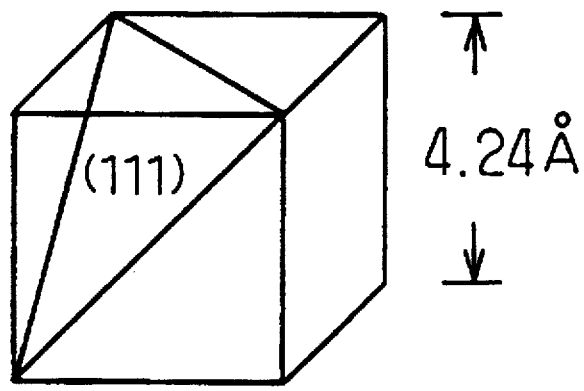
FIG. 9A is a view showing the crystal structure of titanium nitride.
Figure 9B:
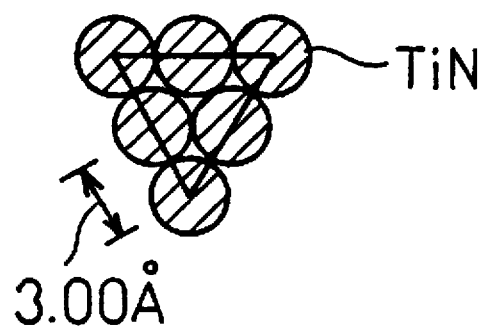
FIG. 9B is a model view showing the arrangement of atoms on the (111) plane thereof.

FIG. 7A illustrates the crystal structure of the Ti$_3$AlN, while FIG. 7B illustrates the atomic arrangement and interatomic distance of the Ti$_3$AlN (111) plane in connection with the upper aluminum layer or the lower titanium nitride layer. FIG. 8A illustrates the crystal structure of the aluminum, while FIG. 8B illustrates the atomic arrangement and interatomic distance of the Al (111) plane. FIG. 9A illustrates the crystal structure of the titanium nitride, while FIG. 9B illustrates the atomic arrangement and interatomic distance of the TiN (111) plane.

Figure 10:
FIG. 10 is a transmission electron microscopic photograph of the Ti—Al—N layer of the semiconductor device illustrated in FIG. 1 viewed at a magnifying power of 2,000,000.
Figure 11:
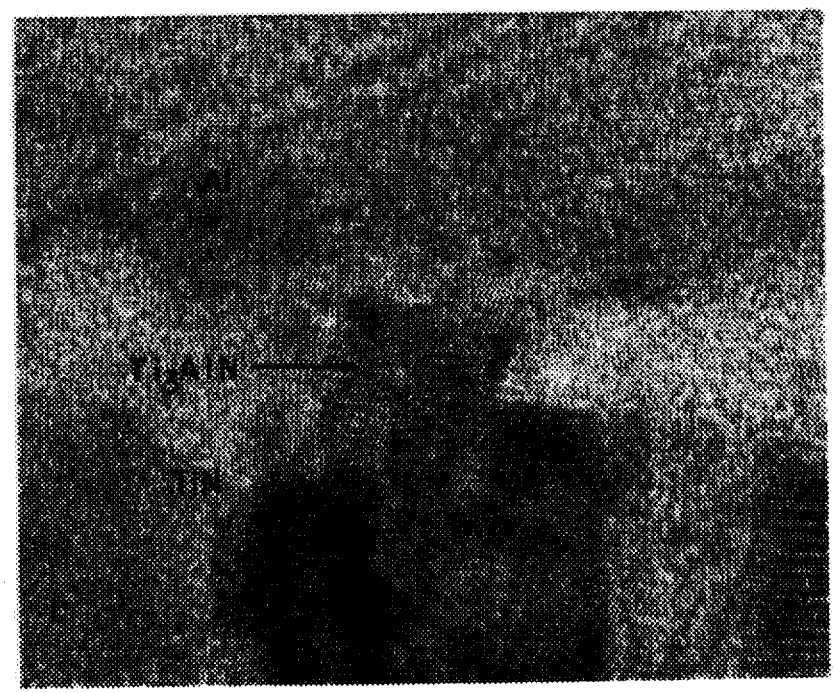
FIG. 11 is a transmission electron microscopic photograph of the Ti—Al—N layer of the semiconductor device illustrated in FIG. 1 viewed at a magnifying power of 3,200,000.

The atomics of these three materials have the same atomic arrangement. The interatomic distance of the Ti$_3$AlN is larger than the interatomic distance of the aluminum by approximately 2% and smaller than that of the titanium nitride by approximately 3%. It is generally said that the crystal lattice strain is at most 5% for achieving lattice matching. Here, the improvement in the orientational effect of the Al (111) plane is considered to have been caused by the lattice matching of the Ti—Al—N family compound with the aluminum and titanium nitride. FIG. 10 shows a transmission electron microscopic photograph of the Ti—Al—N layer 14 of the semiconductor device formed under the condition No. 6. This photograph shows an observation viewed in the cross-sectional direction at a magnification of 2,000,000. Between the aluminum alloy and the titanium nitride is recognized a Ti—Al—N family compound with a thickness of approximately 4 nm. FIG. 11 is a magnification of the Ti—Al—N family compound magnification of 3,200,000. In this photograph, lattice pattern is observed, which was produced by the diffractive phenomenon of electrons caused to a plane where atoms were regularly arranged. The area of regular lattice pattern means the presence of crystals. Between the grains of the aluminum and titanium nitride are formed a plurality of fine grains of several atomic orders. Clearly observed among the fine grains is the Ti$_3$AlN, the crystal surface of which is properly lattice-matched. With the production of this compound in a large quantity on the interface of the aluminum and titanium nitride, the orientational effect of the (111) plane of the wiring of the aluminum alloy 15 can be remarkably be improved.

As described above, as the Ti—Al—N family compound composing the Ti—Al—N layer 14 is formed through reaction between the aluminum and titanium nitride, the quality of the titanium nitride layer is greatly influenced. Therefore, the depositing conditions of titanium nitride are restricted. It is preferable that the effective substrate temperature during the deposition should be set to a range from 200° C. (390° F.) to 300° C. (572° F.). However, if a defect is possibly caused to the aluminum alloy wiring during the deposition thereof, the effective substrate temperature may be lowered to a range from 100° C. (212° F.) to 150° C. (302° F.) and heat treatment may be applied at the effective substrate temperature ranging from 200° C. (390° F.) to 300° C. (572° F.) for tens minutes after the deposition. By this alternative treatment, the same effect as that of the former treatment can be obtained. On the other hand, the depositing pressure of N$_2$—Ar gas is largely related to the orientational effect of the aluminum. For this reason, the depositing pressure of N$_2$—Ar gas is considered to be appropriate at 2 to 7 mTorr. However, at a low depositing pressure, as the closeness of the TiN is low and the above reaction may be insufficient, a range of 5 to 7 mTorr should be the most appropriate. When this range was raised to 3.3 to 5.5 mTorr in an experiment, it was confirmed that the occurrence of Al voids could be reduced to approximately ⅓.

Figure 12:
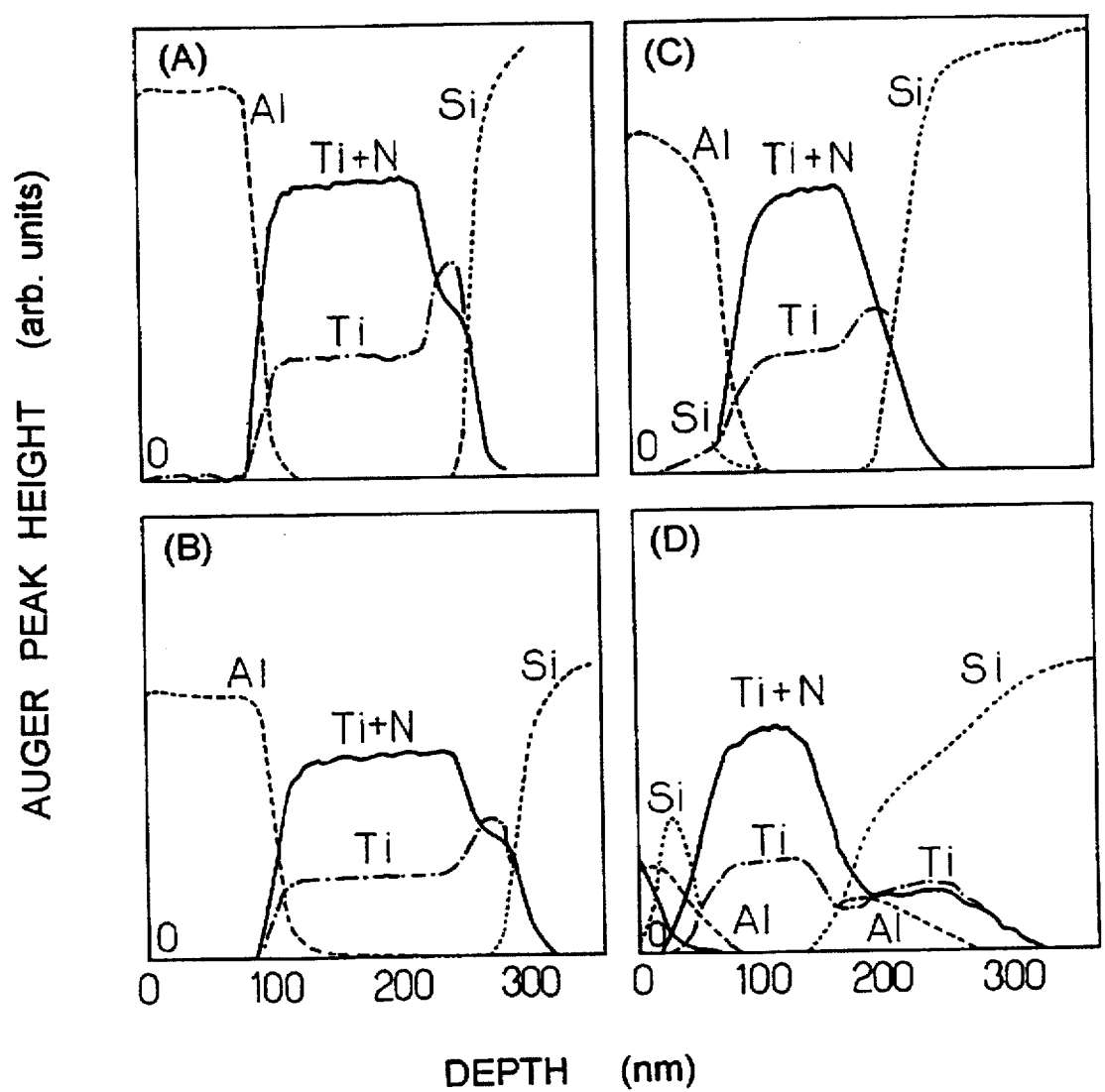
FIGS. 12(A)–12(D) are charts showing Auger depth profiles for the samples (A) before annealing and after annealing at the temperature of (B) 300° C., (C) 450° C. and (D) 600° C. for 30 min, respectively.

Lastly, an examination was made to confirm whether or not the semiconductor device according to the present invention formed as described above has a sufficient barrier effect by using a depth distribution analysis of Auger electron spectroscopy. FIGS. 12(A)–12(C) are charts showing Auger depth profiles for the samples (A) before annealing and after annealing at the temperature of (B) 300° C., (C) 450° C. and (D) 600° C. for 30 min, respectively. It is observed that after annealing at 450° C. (842° F.) for 30 minutes, the aluminum and the silicon have not yet diffused after the penetration through the titanium nitride composing a barrier layer, and therefore the barrier effect is maintained. However, after annealing at 600° C. (1112° F.) for 30 minutes, the aluminum and the silicon are detected on the substrate and the surface respectively, and the barrier effect has been lost. Accordingly, it is understood that even if a Ti—Al—N family compound is produced at the interface of the aluminum alloy and the titanium nitride through annealing at 450° C. (842° F.), the aluminum has not spiked, and therefore the barrier effect is sufficiently maintained. It is also confirmed that before and after annealing, no oxygen is detected within each layer and at the interface between each layer.

As described above, in this embodiment, the orientational effect of the (111) plane of the aluminum alloy 15 can be improved by inserting the Ti—Al—N layer composing the second nitride between the titanium nitride layer 13 composing the first nitride and the aluminum alloy 15 to make the crystal structure similar to each other. In this arrangement, the reliability of the titanium nitride layer as a barrier layer can be maintained and at the same time Al voids can be prevented. As a result, various troubles, such as the disconnection of aluminum alloy wiring, the increase in wiring resistance due to the reduction in the cross section of aluminum alloy wiring, the breakage of elements due to heat generation, the delay in operation speed and electromigration due to the application of large current, can be prevented.

In this embodiment, as a method of producing the Ti—Al—N family compound composing the Ti—Al—N layer 14, the interface between the aluminum alloy 15 and the titanium nitride layer 13 is heat-treated. According to the present invention, however, any method of producing the Ti—Al—N family compound may be used. For example, Ti$_3$AlN or the like may be formed directly on the TiN by means of vapor deposition, CVD, MBE or spattering, or Ti$_3$AlN or the like may be produced by injecting the aluminum into the titanium nitride by the above method and then applying heat treatment. Furthermore, in the above embodiment, the titanium nitride is used as the first nitride. However, as long as the first nitride is a nitrogen compound, components thereof may freely be changed. For example, a W—N family compound or the like may be used instead. On the other hand, the aluminum alloy should not be limited to Al—Si—Cu, but any other aluminum alloy may alternatively be used, such as a pure aluminum metal, Al—Ti—Si, Al—Cu, Al—Si, Al—Ti and Al—Cu—Ti. Moreover, the barrier layer may be composed of a metal with a high melting point, a metal nitride with a high melting point or a metal silicide with a high melting point. The second nitride does not have to be composed of a single layer but may be composed of multiple layers. Here, the multiple layer structure means a stratification in which materials with slightly different crystal structure or interatomic distance are arranged in order of size to further match the crystallinity within the stratification.

What is claimed is:

1. An electrode for a semiconductor device comprising:

a barrier layer disposed on a substrate and composed of an intermetallic compound containing a metal with a high melting point and nitrogen (N);

a nitride layer disposed on said barrier layer and defined by an intermetallic compound containing an element making up said barrier layer and aluminum (Al) as components thereof, said nitride layer having a thickness of at least 30 Å; and an aluminum alloy wiring disposed on said nitride layer such that a crystal surface thereof is oriented mainly at the (111) plane, wherein:

an oxygen concentration in said barrier layer is no greater than 1 at %;

an oxygen concentration at an interface between said barrier layer and said nitride layer is no greater than 1 at %; and a margin of difference between an interatomic distance of said nitride layer and an interatomic distance of said aluminum alloy wiring is no greater than 5%.

2. The electrode for a semiconductor device according to claim 1, wherein said substrate is composed of a silicon (Si) substrate;

said barrier layer is composed of titanium nitride (TiN); and said nitride layer is composed of $Ti_3AlN$ mainly.

3. The electrode for a semiconductor device according to claim 1, wherein said barrier layer contains no oxygen or said oxygen concentration is no greater than 1 at %;

said aluminum alloy wiring is disposed on said barrier layer such that said aluminum alloy wiring contains no oxygen or an oxygen concentration of said aluminum alloy wiring is no greater than 1 at %;

said nitride layer is disposed between said barrier layer and said aluminum alloy wiring by annealing said barrier layer and said aluminum alloy wiring.

4. The electrode for a semiconductor device according to claim 1, wherein a margin of difference between an interatomic distance of said barrier layer and an interatomic distance of said nitride layer is 5% or less.

5. The electrode for a semiconductor device according to claim 1, wherein a thickness of said nitride layer is at least 40 Å;

a margin of difference between an interatomic distance of said barrier layer and an interatomic distance of said nitride layer is no greater than 3%; and a margin of difference between an interatomic distance of said nitride layer and an interatomic distance of said aluminum alloy wiring is no greater than 3%.

6. The electrode for a semiconductor device according to claim 1, wherein said metal with a high melting point contained in said barrier layer is selected from the group consisting of titanium (Ti), tungsten (W) and molybdenum (Mo).

* * * * *